United States Patent [19]

Iizuka

[11] Patent Number: 5,500,028
[45] Date of Patent: Mar. 19, 1996

[54] REMOVABLE FILTER DEVICE FOR ARTICLE STORING ARRANGEMENT

[75] Inventor: Yukio Iizuka, Komaki, Japan

[73] Assignee: Daifuku Co., Ltd., Osaka, Japan

[21] Appl. No.: 236,263

[22] Filed: May 2, 1994

[30] Foreign Application Priority Data

Aug. 6, 1993 [JP] Japan .................... 5-195019

[51] Int. Cl.⁶ .................... B01D 46/10
[52] U.S. Cl. .................... 55/385.1; 55/385.4; 55/483; 55/484; 55/495; 312/31.2; 312/31.3; 312/223.1; 360/47.02
[58] Field of Search .................... 55/385.1, 385.4, 55/385.7, 483, 484, 492, 495, 496, 504, 472, DIG. 31; 312/31.2, 31.3, 223.1; 454/184, 193; 360/97.02

[56] References Cited

U.S. PATENT DOCUMENTS

| | | | |
|---|---|---|---|
| 3,246,456 | 4/1966 | Sharp | 55/483 |
| 3,266,170 | 8/1966 | Lawrence, III | 55/DIG. 31 |
| 3,370,404 | 2/1968 | Leeper | 55/483 |
| 3,828,530 | 8/1974 | Peters | 55/504 |
| 4,023,529 | 5/1977 | Landy | 55/472 |
| 4,913,085 | 4/1990 | Vohringer et al. | 55/483 |
| 4,951,555 | 8/1990 | Hahn et al. | 55/385.4 |
| 4,963,069 | 10/1990 | Wurst et al. | 55/385.1 |
| 5,219,464 | 6/1993 | Yamaga et al. | 55/385.1 |
| 5,261,935 | 11/1993 | Ishii et al. | 55/472 |
| 5,346,518 | 9/1994 | Baseman et al. | 55/385.1 |

FOREIGN PATENT DOCUMENTS 3-152004  6/1991  Japan .

*Primary Examiner*—Jay H. Woo
*Assistant Examiner*—Duane S. Smith
*Attorney, Agent, or Firm*—Barnes, Kisselle, Raisch, Choate, Whittemore & Hulbert

[57] ABSTRACT

An article storing arrangement having a filter device 11 mounted to the back side of an article storing shelf assembly 4, the filter device 11 having a mounting frame member 12 removably attached to a support frame 6, a filter 14 provided at a position corresponding to an opening of the mounting frame member 12, and a cover member 17 covering the outer surface of the filter 14, the cover member 17 having an air inlet port 20 at the top thereof. The filter device is mounted to the support frame through the mounting frame member. Therefore, when a filter performance test is required in an actually mounted condition, such a test can be carried out simply by fixing the filter device to the mounting frame member. Accordingly, such performance test can be effected with far much greater ease than in the case where a performance test is carried out, for example, by attaching the filter, cover member, and the like directly to the support frame.

2 Claims, 4 Drawing Sheets

REMOVABLE FILTER DEVICE FOR ARTICLE STORING ARRANGEMENT

FIELD OF THE INVENTION

This invention relates to an article storing arrangement for storing articles, such as semiconductor components, which are likely to be unfavorably affected by dust.

BACKGROUND OF THE INVENTION

Hitherto, an article storing arrangement of this type has been known as disclosed in Japanese Patent Application Laid-Open No. 3-152004.

This article storing arrangement includes a box-like enclosure body, a passage formed centrally in the enclosure body, and shelf assemblies for storing articles disposed on both sides of the passage. Each of the shelf assemblies comprises shelves arranged in plural tiers to provide spaces for placement of articles therein, the shelf assembly being located within a support frame constituting a structural member of the enclosure body of the article storing arrangement. A filter is attached to the outer surface of each support frame in which the shelf assembly is disposed. At a position external of the filter and between the filter and an outer side of the enclosure body there is disposed a partition wall secured to a component member of the enclosure body. A space is defined between the partition wall and the filter to provide an air supply passage.

Therefore, a stream of air supplied by a blower into the air supply passage is rendered highly clean through dust removal therefrom by the filter, and the air thus cleaned is introduced into the storage space from the outer side of the enclosure body. The air introduced into the storage space is recirculated to the air supply passage side by the blower.

According to the above described article storing arrangement of the prior art, the filter is attached directly to a support frame which is a constituent member of the enclosure body. Therefore, for the purpose of ascertaining the performance characteristics of the filter, it is necessary to do so under an actually mounted condition. As such, filter mounting is actually required for each performance test, which is very troublesome.

SUMMARY OF THE INVENTION

It is an object of the invention to provide an article storing arrangement which is adapted for easy performance test and is easy to fabricate and easy to handle.

In order to accomplish the above object, according to the invention there is provided an article storing arrangement having a filter device mounted to the back side of an article storing shelf assembly, the filter device comprising a mounting frame portion removably attached to a body of the article storing arrangement, a filter provided at a position corresponding to an opening of the mounting frame portion, and a cover member covering the the outer surface of the filter so as to provide a predetermined clearance, the cover member having an air inlet port formed in a specified portion thereof.

According to the foregoing arrangement of the invention, the filter device is mounted to the body of the storing arrangement through the mounting frame portion. Therefore, when a filter performance test is required in an actually mounted condition, such a test can be carried out simply by fixing the filter device to the mounting frame portion. Accordingly, such performance test can be effected with far much greater ease as compared with the prior art arrangement in which it has been required that the filter, cover member, and the like be attached directly to the body of the storing arrangement in carrying out a performance test.

In one embodiment of the invention, the mounting frame portion, filter and cover member are removably attached to the body through a common fixing element.

According to this one embodiment, mounting and removal of the filter device relative to the body can be performed in easy and quick one-touch operation.

In another embodiment of the invention, the filter and cover member are respectively split into plural parts and the so split filter parts are attached integrally to the corresponding split cover member parts to form modularized units.

According to this another embodiment, the filter and cover member are split into plural parts for modularization, which results in greater ease of manufacture and handling.

In still another embodiment of the invention, the cover member parts, with the split filter parts integrally attached thereto, have pairs of communication ports at their respective opposite sides such that one of adjacent communication ports has a flange portion formed at an edge portion thereof which is insertable into the other communication port.

According to this still another embodiment, a plurality of modular units can be easily and accurately assembled by inserting each such flange portion into an adjacent communication port.

DESCRIPTION OF THE EMBODIMENTS

One embodiment of the invention will now be described with reference to FIGS. 1 to 3.

Figure 1:
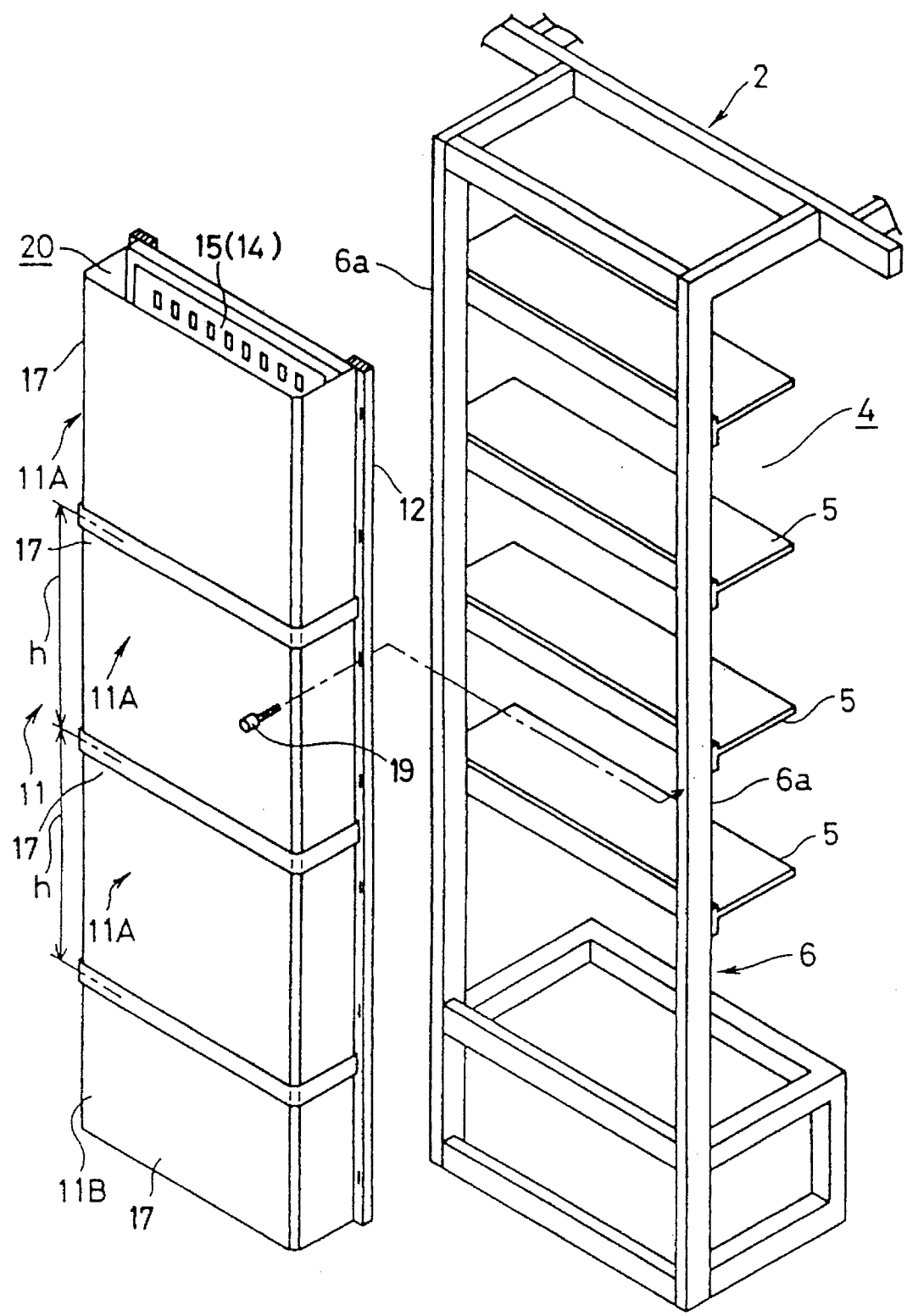
FIG. 1 is an exploded perspective view showing principal portions of an article storing arrangement according to one embodiment of the invention.
Figure 2:
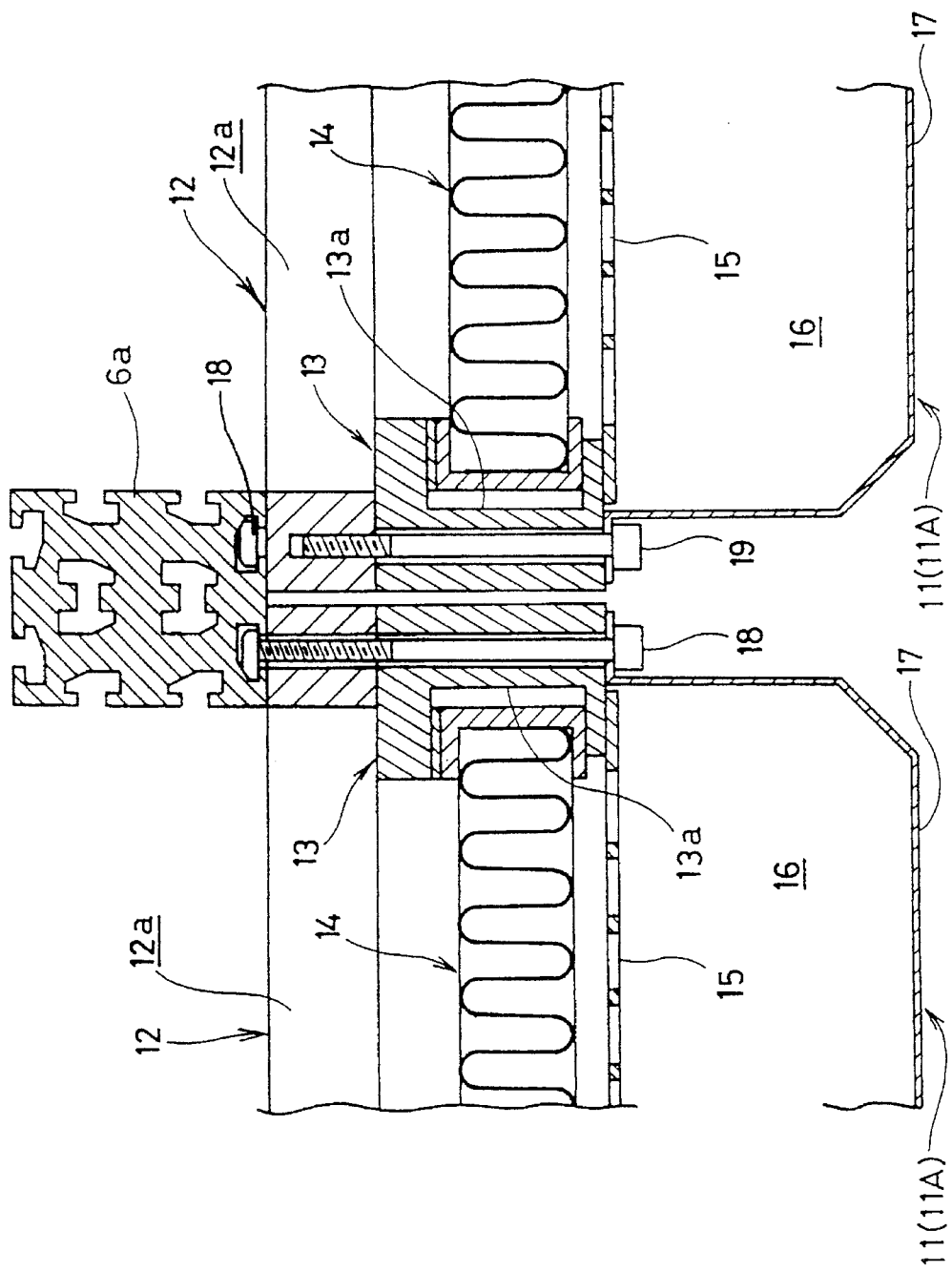
FIG. 2 is a horizontal sectional view showing principal portions of a filter device as mounted to a support frame in the embodiment.
Figure 3:
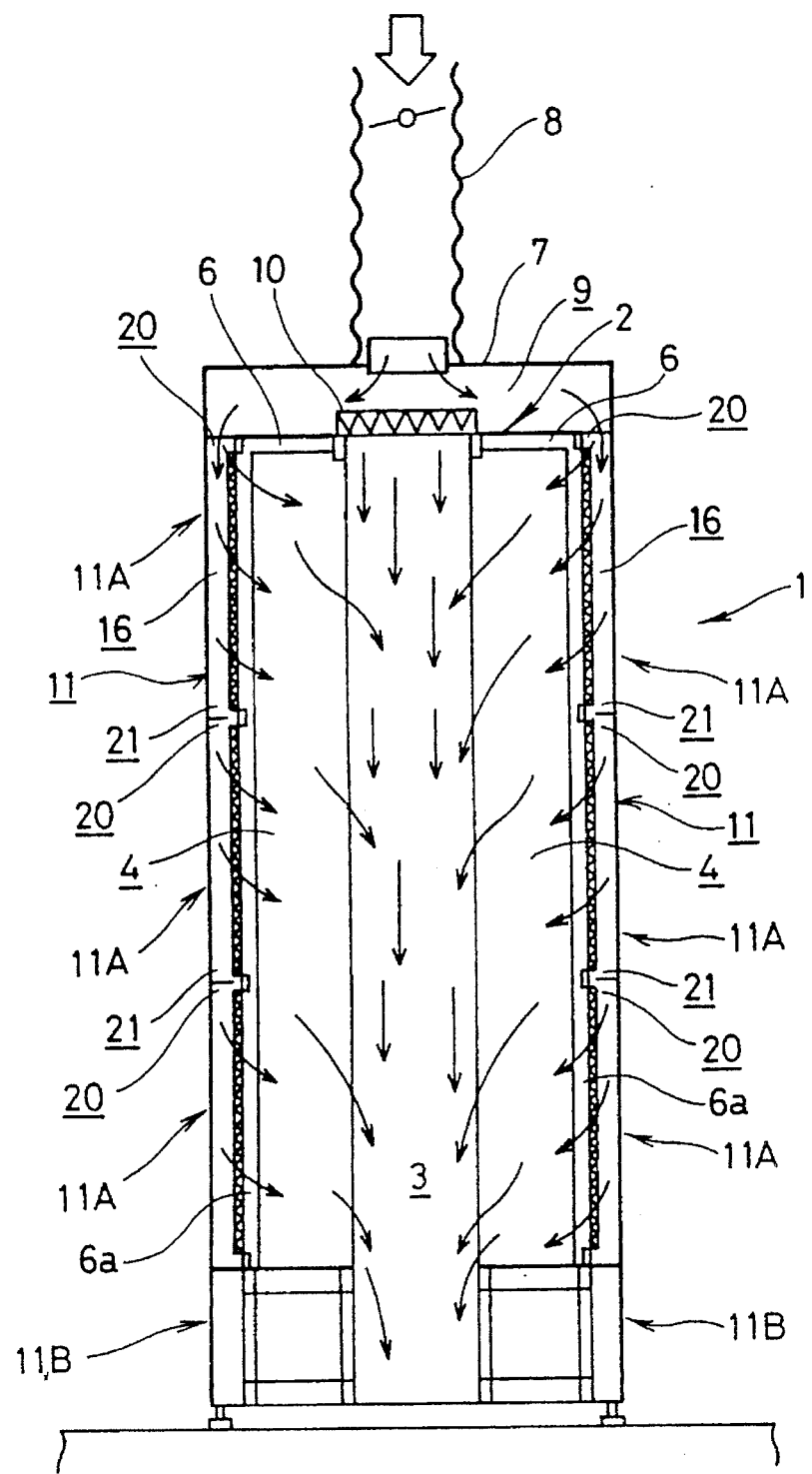
FIG. 3 is a sectional view showing a schematic arrangement of the article storing arrangement of the same embodiment.

In FIGS. 1 to 3, reference numeral 1 designates an article storing arrangement for storing articles such as, for example, semiconductor components, which are likely to be adversely affected by dust. The article storing arrangement includes a body 2, a passage 3 formed centrally in the body 2, and article storing spaces 4 provided on both sides of the passage 3. Within each of the storing spaces 4 and in a support frame 6 which is a constituent member of the body 2, storage shelves 5 for placement of articles thereon are arranged in plural tiers.

A filter device 11 is attached to the outer side of each support frame 6 which is mounted with storage shelves 5 therein.

As FIG. 1 and 2 show, the filter device 11 comprises a mounting frame member (mounting frame) 12 removably attached to the outer surface of support posts 6a of the support frame 6 (the body side), a holding member 13 provided at a position corresponding to an opening 12a defined in the mounting frame member 12, a filter 14 inserted and held in a groove portion 13a of the holding member 13, a porous plate (made of, for example, punching metal) 15 attached to the outer surface of the holding member 13, and a cover member 17 attached likewise to the outer surface of the holding member 13 and defining an air passage (a clearance) between the member 17 and the filter (or, in more exact terms, a porous plate) 14.

The mounting frame member 12 is configured to have a rectangular shape corresponding to one block of the support frame 6 and is removably attached, together with the holding member 13 and the cover member 17, to the outer side of the support posts 6a through a common mounting bolt (fixing element) 18 or the like. The holding member 13 is removably fixed, together with the cover member 17, to the outer side of the mounting frame member 12 through a common fixing bolt 19. An air inlet port 20 is formed at the top side of the cover member 17. In FIG. 2, filter devices 11 are shown as being mounted in parallel.

As FIG. 1 shows, the filter 14 and the cover member 17 are split into plural parts (upper three parts, for example, in FIG. 1) arranged in vertical series to provide modularized units.

More specifically, the holding member 13, filter 14, porous plate 15, and cover member 17 are respectively split into parts having a predetermined height (h) and integrally joined into modules. Each of the modularized portions is hereinafter referred to as a filter member 11A. It is noted that the lowermost one of the modularlized portions does not include a filter 14 portion because it is not a portion corresponding to a storage shelf; therefore, the lowermost portion is a cover member 11B consisting at least of a cover member 17 portion fixed in position. In case that a separate filter member 11A is placed below and connected to the plurality of filter members 11A, the filter member 11A positioned immediately above the separate filter member 11A has an air outlet port 21 formed at its bottom, as shown in FIG. 3.

As FIG. 1 shows, the modularized filter members 11A are sequentially fixed to the mounting frame member 12 through such a fixing bolt 19 as above mentioned. In turn, as FIG. 2 shows, the filter device 11 which consists of the plurality of filter members 11A (including the cover member 11B) fixed to the mounting frame member 12 is attached to the support posts 6a of the support frame 6 through a common mounting bolt 18.

FIG. 3 shows a general sectional view of the article storing arrangement 1. As shown, above the storage spaces 4 is located a ceiling wall portion 7 which defines an air introducing chamber 9 communicating with an air intake duct 8 so that air from the air introducing chamber 9 is conducted to the passage 3 and also into the air passage 16 in each cover member 17. An upper filter 10 is disposed above the passage 3.

In this way, the filter device 11 is mounted to the support frame 6 through the mounting frame member 12. Therefore, for purposes of performance tests with respect to filter 14 in actually mounted condition, such a test can be carried out simply by attaching the filter device 11 to the mounting frame member 12. Accordingly, such performance test is very much simplified as compared with the case that the filter, cover member and the like are required to be attached directly to the support frame in carrying out such a test.

The fact that the filter device 11 is split into plural parts of a predetermined size for modularization provides for much greater ease of manufacture and handling.

Figure 4:
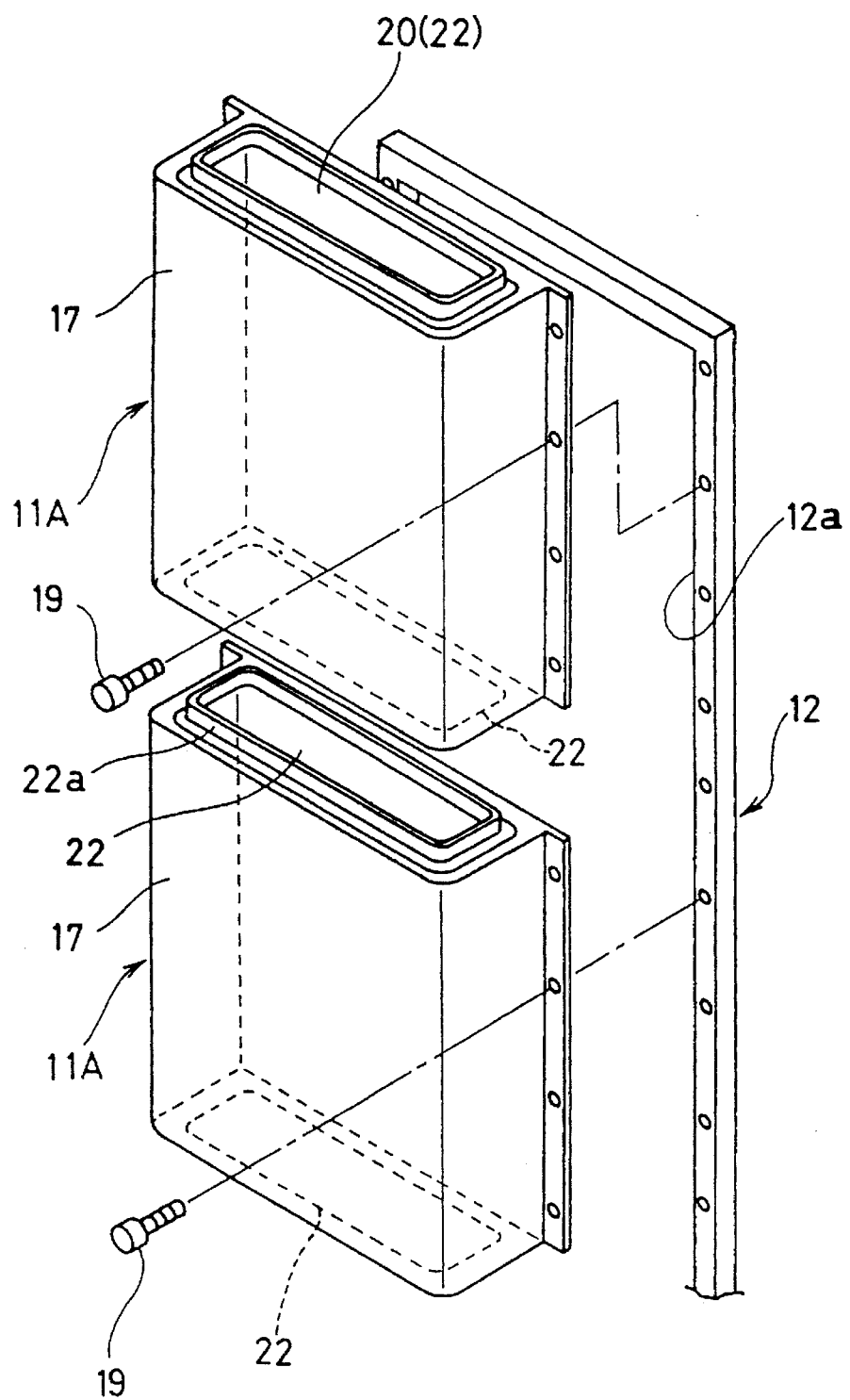
FIG. 4 is an exploded perspective view showing a modified form of the filter device in the embodiment.

In the above described embodiment, upper and lower openings of the cover member 17 of each filter member 11A are utilized for introduction of air into each filter 14. Alternatively, as FIG. 4 shows, the top and bottom (a pair of sides) of each cover member 17 are formed with a communication port 22 of a specified configuration and the edge of each such communication port 22 is configured to rise slightly upward to provide a flange portion 22a. Such arrangement permits one flange portion 22a to be inserted into the communication port 22 of an adjacent cover member 17, whereby it is possible to easily and accurately assemble a plurality of modularized units.

In the foregoing embodiment, air from the air introducing chamber 9 is conducted into the air passage 16 from above. It may be arranged that the air is conducted from below or from the exterior. A load transfer device may be provided in the passage 3 to automatize delivery to and from storage shelves 5.

What is claimed is:

1. A removable filter device fitted to the rear of an article storing shelf assembly of an article storing arrangement having a body, said removable filter device comprising:

a mounting frame portion having an opening and removably attached to the body of the article storing arrangement;

a filter having an outer surface and disposed at a position corresponding to the opening in the mounting frame portion; and a cover covering the outer surface of the filter while keeping a selected clearance therebetween;

said cover having an air inlet portion formed therein:

wherein the removable filter device is divided into a plurality of intercommunicating modular units having communication ports for the introduction of air, each modular unit having a cover member and a filter member, each cover member comprising a portion of said cover and each filter member comprising a portion of said filter.

2. A removable filter device fitted to the rear of an article storing shelf assembly of an article storing arrangement as set forth in claim 1, wherein the cover member for each modular unit of the filter device has a pair of said communication ports formed on opposite sides thereof, one of said pair of communication ports having an outwardly extending flanged end portion insertable into the other of said pair of communication ports of an adjoining cover member, whereby additional modular unit may be included in the filter device, as desired.

* * * * *